United States Patent
Tombelli et al.

(10) Patent No.: US 11,787,296 B2
(45) Date of Patent: Oct. 17, 2023

(54) METHOD FOR PAIRING ELECTRIC VEHICLES AND POWER TERMINALS IN A POWER STATION FOR ELECTRIC VEHICLES

(71) Applicant: ABB Schweiz AG, Baden (CH)

(72) Inventors: Fabio Tombelli, Terranuova Bracciolini (IT); Oscar Apeldoorn, Lengnau (CH)

(73) Assignee: ABB E-mobility B.V., Delft (NL)

( * ) Notice: Subject to any disclaimer, the term of this patent is extended or adjusted under 35 U.S.C. 154(b) by 217 days.

(21) Appl. No.: 17/057,725

(22) PCT Filed: May 24, 2018

(86) PCT No.: PCT/EP2018/063627
§ 371 (c)(1),
(2) Date: Nov. 23, 2020

(87) PCT Pub. No.: WO2019/223868
PCT Pub. Date: Nov. 28, 2019

(65) Prior Publication Data
US 2021/0197678 A1    Jul. 1, 2021

(51) Int. Cl.
*B60L 53/126* (2019.01)
*H02J 50/12* (2016.01)
*B60L 53/60* (2019.01)
*B60L 50/60* (2019.01)
*B60L 53/30* (2019.01)
(Continued)

(52) U.S. Cl.
CPC ........... *B60L 53/126* (2019.02); *B60L 50/60* (2019.02); *B60L 53/122* (2019.02); *B60L 53/305* (2019.02); *B60L 53/60* (2019.02); *G01R 31/006* (2013.01); *H02J 7/00032* (2020.01); *H02J 7/04* (2013.01); *H02J 50/12* (2016.02)

(58) Field of Classification Search
CPC .................................................... B60L 53/126
USPC ................................................... 320/108
See application file for complete search history.

(56) References Cited

U.S. PATENT DOCUMENTS

2012/0262002 A1   10/2012  Widmer
2014/0012448 A1    1/2014  Tripathi et al.
(Continued)

FOREIGN PATENT DOCUMENTS

CN    102447286 A    5/2012
CN    103795154 A    5/2014
(Continued)

OTHER PUBLICATIONS

European Patent Office, International Search Report & Written Opinion issued in corresponding Application No. PCT/EP2018/063627, dated Jan. 31, 2019, 15 pp.
(Continued)

*Primary Examiner* — Jerry D Robbins
(74) *Attorney, Agent, or Firm* — Armstrong Teasdale LLP

(57) ABSTRACT

A method for pairing a power terminal and an electric vehicle in a power station for electric vehicles, wherein the method includes powering the terminal-side coil stage of a power terminal with a test electric quantity to determine whether the power terminal and an electric vehicle are in a paired condition, at which the power terminal and the electric vehicle can exchange electric power, or in an unpaired condition, at which the power terminal and the electric vehicle cannot exchange electric power.

20 Claims, 3 Drawing Sheets

Figure 1:
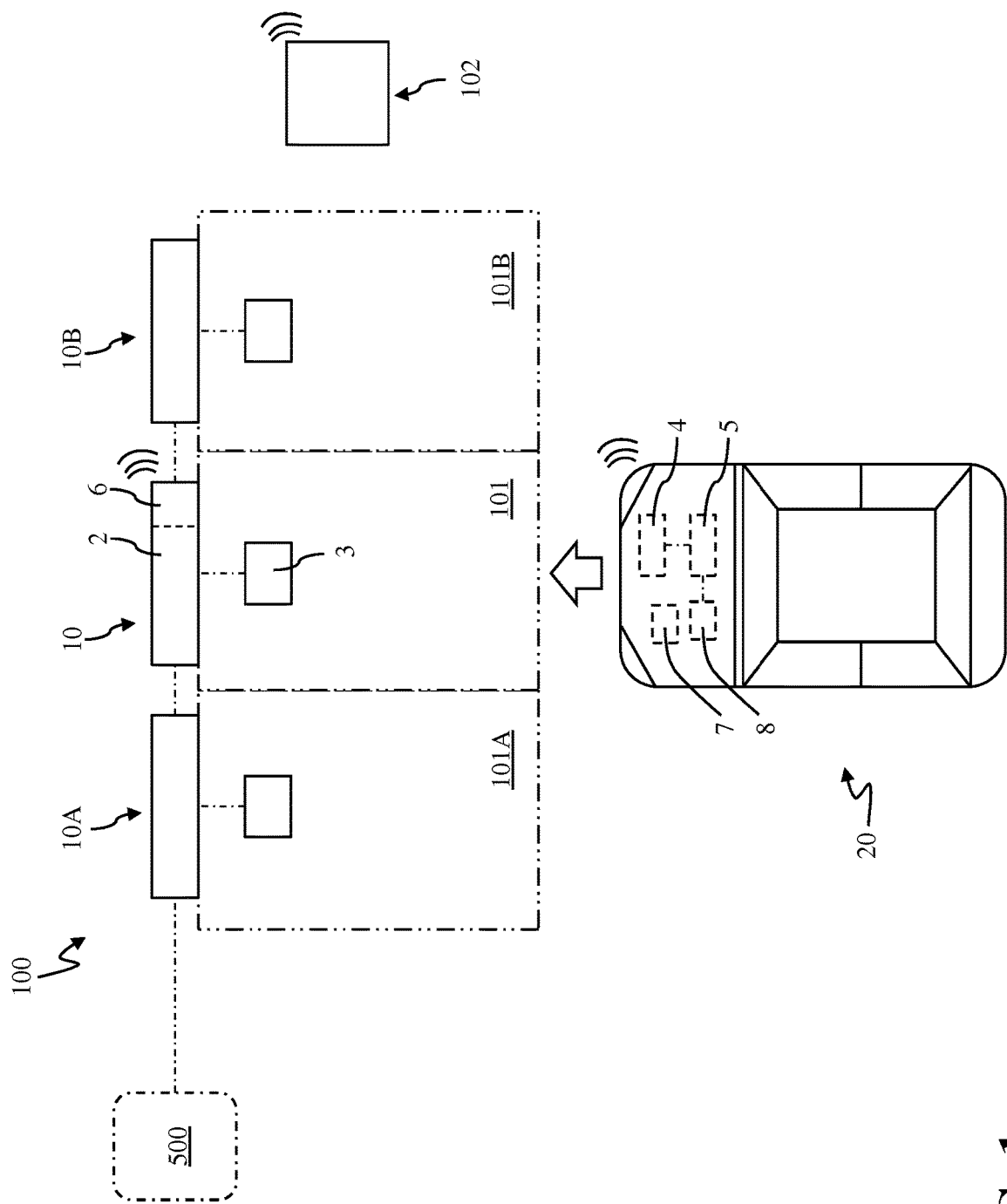

(51) Int. Cl.
*B60L 53/122* (2019.01)
*H02J 7/00* (2006.01)
*G01R 31/00* (2006.01)
*H02J 7/04* (2006.01)

(56) References Cited

U.S. PATENT DOCUMENTS

| | | | |
|---|---|---|---|
| 2014/0167985 A1 | 6/2014 | Halnais et al. | |
| 2015/0015419 A1 | 1/2015 | Halker et al. | |
| 2015/0042168 A1 | 2/2015 | Widmer | |
| 2016/0075239 A1* | 3/2016 | Briz | B60L 53/12 320/108 |
| 2016/0159226 A1* | 6/2016 | Tsukamoto | B60L 58/12 701/22 |
| 2017/0264143 A1* | 9/2017 | Lee | H01F 38/14 |
| 2019/0294135 A1* | 9/2019 | Madrid | G05B 19/0426 |
| 2020/0343751 A1* | 10/2020 | Colosimo | H02J 50/12 |
| 2022/0274503 A1* | 9/2022 | Shin | B60L 53/126 |

FOREIGN PATENT DOCUMENTS

| | | | | |
|---|---|---|---|---|
| CN | 104795875 A | * | 7/2015 | ............ B60L 11/182 |
| CN | 104795875 A | | 7/2015 | |
| CN | 105406606 A | | 3/2016 | |
| DE | 102012006919 A1 | | 10/2013 | |
| EP | 2985850 A1 | | 2/2016 | |
| EP | 2727213 B1 | | 10/2017 | |
| EP | 3248828 A1 | | 11/2017 | |
| EP | 3315351 A2 | | 5/2018 | |

OTHER PUBLICATIONS

Office Action and Search Report issued in Chinese Patent Application No. 201880093748.7, with English Translation, 21 pages.
Office Action issued in European Patent Application No. 18729602.5, dated Mar. 2, 2022, 6 pages.

* cited by examiner

METHOD FOR PAIRING ELECTRIC VEHICLES AND POWER TERMINALS IN A POWER STATION FOR ELECTRIC VEHICLES

The present invention relates to the field of power stations for electric vehicles. More particularly, the present invention concerns a method for managing pairing between power terminals of a power station and electric vehicles accessing to said station.

Power stations for electric vehicles are well known in the state of the art.

As is known, power stations often employ power terminals capable of inductively exchanging electric power with electric vehicles.

In operation, an inductive power terminal employs a coil placed on or embedded in a ground surface to inductively exchange electric power with a paired coil mounted on board an electric vehicle through the air gap between the ground surface and the vehicle itself. In this way, electric power may be exchanged in a wireless manner.

Typically, inductive power terminals are used to charge the electric battery of the electric vehicles paired thereto, i.e. to transfer electric power from an electric power source (e.g. the mains) electrically connected with said power terminals to the battery of the electric vehicles. However, in some cases, these power terminals may be employed to transfer electric power from the battery of the electric vehicles to an electric system electrically connected with said power terminals.

In general, a power station comprises a number of parking spaces, at which inductive power terminals are installed. Normally, an electric vehicle accessing to the power station navigates through said parking spaces to find a suitable power terminal to carry out the desired electric power exchange process. However, as electric vehicles and inductive power terminals are designed to mutually interact in a wireless manner, the pairing process between the electric vehicle and the power terminal at which the electric vehicle is parked may be disturbed or made more difficult by the power terminals installed at adjacent parking spaces.

Additionally, the electric vehicle may attempt to pair with these surrounding power terminals instead of the correct power terminal at which it is parked.

In general, these issues may be overcome or mitigated by properly managing pairing among electric vehicles accessing to the power station and installed inductive power terminals.

Solutions actually available in the state of the art, such those disclosed in US2014/0167985 and EP2727213A1, have shown to be relatively complex and expensive to realize in practice, especially because they need the arrangement of dedicated hardware (e.g. sensors, cameras, visual or audio interfaces, and the like) at each power terminal or parking space of the power station for being implemented.

The main aim of the present invention is to provide method for pairing a power terminal and an electric vehicle in a power station, which allows overcoming the above-described disadvantages.

Within this aim, another object of the present invention is to provide a method providing an efficient management of the pairing process between installed wireless inductive power terminals and electric vehicles accessing to said station.

Another object of the present invention is to provide a method relatively easy and inexpensive to carry out in practice without the need of dedicated hardware arranged at the power terminals or on board the electric vehicles.

The above aim and objects, together with other objects that will be more apparent from the subsequent description and from the accompanying drawings, are achieved by a method for pairing a power terminal and an electric vehicle in a power station according to the following claim 1 and the related dependent claims.

According to the invention, said power terminal comprises:
- a terminal-side power stage electrically coupled with an electric power system;
- a terminal-side coil stage electrically coupled with said terminal-side power stage and comprising a terminal-side coil.

According to the invention, said electric vehicle comprises:
- a vehicle-side coil stage comprising a vehicle-side coil inductively coupleable with the terminal-side coil of a power terminal;
- a vehicle-side power stage electrically coupled with said vehicle-side coil stage;
- a battery electrically coupled with said vehicle-side power stage.

According to the invention, said power terminal and said electric vehicle are capable of communicating in a wireless manner. Conveniently, said power terminal is identified by a unique terminal identification code.

The method of the invention comprises powering the terminal-side coil stage of a power terminal with a test electric quantity to determine whether said power terminal and an electric vehicle are in a paired condition, at which said power terminal and said electric vehicle can exchange electric power, or in an unpaired condition, at which said power terminal and said electric vehicle cannot exchange electric power.

Preferably, the method of the invention comprises:
- selecting a power terminal in said plurality of power terminals;
- commanding the terminal-side power stage of the selected power terminal to power the terminal-side coil stage of the selected power terminal with a test electric quantity;
- checking whether an induced electric quantity is provided by said vehicle-side coil stage in response to the powering of the terminal-side coil stage of the selected power terminal with said test electric quantity;
- determining whether the selected power terminal and said electric vehicle are in said paired condition or in said unpaired condition depending on whether said induced electric quantity is provided or not by said vehicle-side coil stage in response to the powering of said terminal-side coil stage.

Preferably, said power terminal and said electric vehicle are determined to be in said paired condition, if said induced electric quantity is provided by said vehicle-side coil stage in response to the powering of said terminal-side coil stage.

Preferably, said power terminal and said electric vehicle are determined to be in said unpaired condition, if said induced electric quantity is not provided by said vehicle-side coil stage in response to the powering of said terminal-side coil stage.

Preferably, said test electric quantity has an intensity level very lower than a nominal intensity level that can be reached during a possible power exchange between the selected power terminal and said electric vehicle.

Preferably, the terminal-side coil stage of the selected power terminal is powered with said test electric quantity for a predetermined period of time.

Preferably, the terminal-side coil stage of the selected power terminal is powered with said test electric quantity at subsequent periodic powering instants.

Preferably, said step of selecting a power terminal comprises carrying out a search procedure of one or more power terminals (conveniently identified by respective unique terminal identification codes) in the nearby of said electric vehicle and carrying out a negotiation procedure with said power terminals to acquire identification information related to said power terminals.

Preferably, said power station comprises a central control unit capable of communicating in a wireless manner with said electric vehicle, said step of selecting a power terminal comprising:
- transmitting position information related to the location of said electric vehicle to said central control unit;
- receiving identification information (conveniently the unique terminal identification codes) related to one or more power terminals in the nearby of said electric vehicle.

Preferably, said step of selecting a power terminal comprises choosing said power terminal (conveniently the related unique identification code) in response to a command received by a user-interface device on board said electric vehicle.

Preferably, said step of selecting a power terminal comprises choosing said power terminal (conveniently the related unique identification code) depending on the strength of a wireless signal transmitted by said power terminal or randomly.

Preferably, said step of selecting a power terminal comprises checking whether said power terminal is available for pairing with said electric vehicle.

Conveniently, the method of the invention is carried out when said electric vehicle is turned off and unable to move.

In a further aspect, the present invention, relates to a power station, according to the following claim 14.

The power station of the invention, comprises a plurality of parking spaces at which corresponding power terminals for exchanging electric power with electric vehicles are installed.

According to the invention, a power terminal comprises:
- a terminal-side power stage electrically coupled with an electric power system;
- a terminal-side coil stage electrically coupled with said terminal-side power stage and comprising a terminal-side coil;
- a terminal-side control unit for controlling operation of said terminal-side power stage and said terminal-side coil stage, said terminal-side control unit comprising a terminal-side wireless transceiver having a unique terminal identification code.

According to the invention, an electric vehicle comprises:
- a vehicle-side coil stage (4) comprising a vehicle-side coil (41) inductively coupleable with the terminal-side coil (31) of a power terminal (10);
- a vehicle-side coil stage comprising a vehicle-side coil inductively coupleable with the terminal-side coil of a power terminal;
- a vehicle-side power stage electrically coupled with said vehicle-side coil stage;
- a battery electrically coupled with said vehicle-side power stage.
- a vehicle-side control unit for controlling operation of said vehicle-side power stage and said vehicle-side coil stage, said vehicle-side control unit comprising a vehicle-side wireless transceiver.

According to the invention, said power terminal (namely the terminal-side control unit thereof) and said electric vehicle (namely the vehicle-side control unit thereof) are capable of communicating in a wireless manner.

According to the invention, said power terminal is adapted to power the respective terminal-side coil stage with a test electric quantity to allow an electric vehicle to determine whether said power terminal and said electric vehicle are in a paired condition, at which said power terminal and said electric vehicle can exchange electric power, or in an unpaired condition, at which said power terminal and said electric vehicle cannot exchange electric power.

Figure 2:
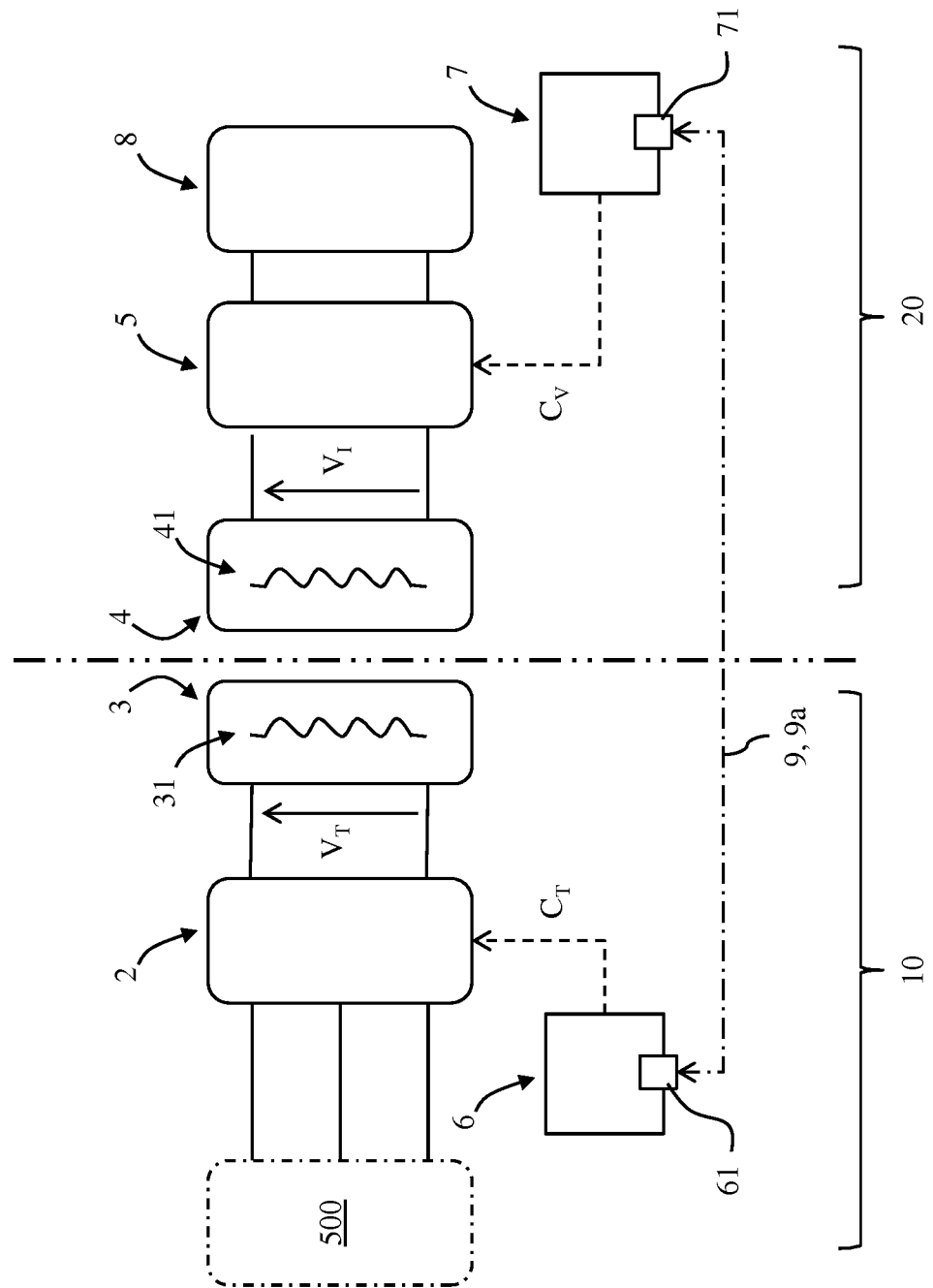
Figure 3:
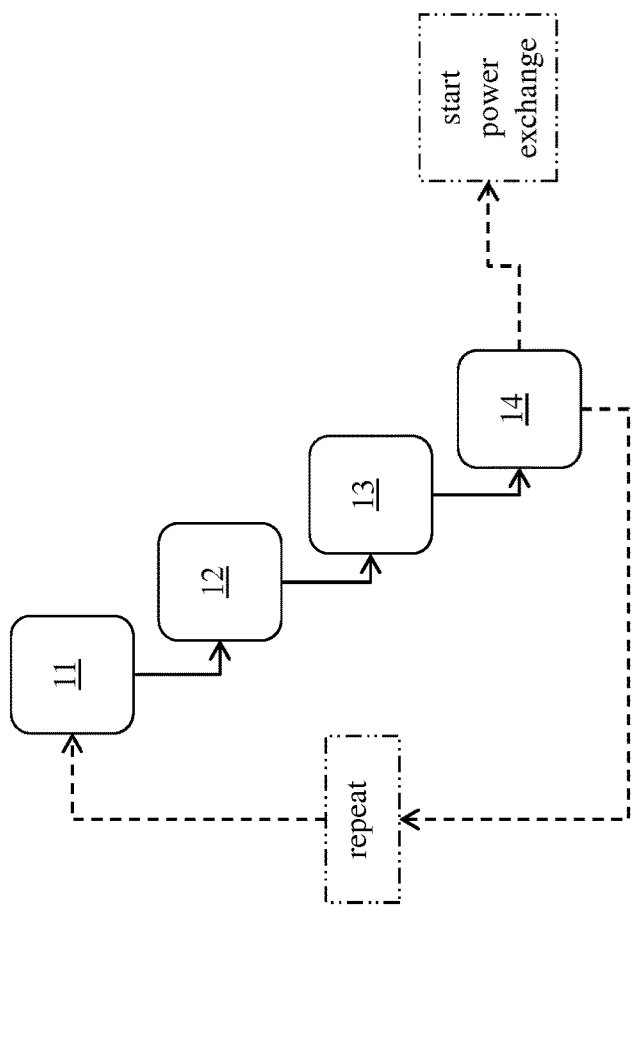

Further characteristics and advantages of the present invention will be more apparent with reference to the description given below and to the accompanying figures, provided purely for explanatory and non-limiting purposes, wherein:

FIG. 1 schematically illustrates a power station, according to the present invention;

FIG. 2 schematically illustrates some parts of a power terminal and an electric vehicle in a power station, according to the present invention;

FIG. 3 schematically illustrates some steps of the method, according to the present invention.

With reference to FIG. 1, the present invention refers to a method 1 for pairing a power terminal and an electric vehicle in a power station 100 for electric vehicles.

The power station 100 comprises a plurality of parking spaces 101, 101A, 101B, at which there are installed power terminals 10, 10A, 10B for exchanging electric power with electric vehicles 20 accessing to the power station.

According to the invention, power terminals 10, 10A, 10B and electric vehicles 20 are capable of communicating in a wireless manner.

Power terminals 10, 10A, 10B are particularly adapted to be used as battery chargers capable of transferring electric power harvested from an electric power system 500 (e.g. the mains) to the battery 8 of electric vehicles accessing the power station 100.

In the following, the present invention will be described with particular reference to this application for the sake of simplicity.

However, power terminals 10, 10A, 10B may be suitable to implement bidirectional power transfer functionalities and therefore they may be employed to transfer electric power from the battery 8 of electric vehicles 20 to the electric power system 500.

A power terminal 10, 10A, 10B comprises a terminal-side power stage 2 electrically coupleable or coupled with the electric power system 500 and adapted to exchange AC electric power with this latter.

Conveniently, the terminal-side power stage 2 comprises suitable electronic circuits (e.g. rectifiers, power converters, DC-bus circuits, filters, sensor arrangements and the like) to implement a controlled AC/DC conversion and DC/AC conversion of electric power.

In general, the terminal-side power stage 2 may be of known type and it will further described in the following only with reference to the aspects of interest for the invention.

A power terminal 10, 10A, 10B further comprises a terminal-side coil stage 3 electrically coupled with the terminal-side power stage 2 and adapted to exchange AC electric power with this latter.

The terminal-side coil stage 3 comprises a terminal-side coil 31, along which an AC current is intended to circulate.

Preferably, the terminal-side coil stage 3 comprises a first resonant capacitor (not shown) electrically coupled (e.g. in series) with the terminal-side coil 31.

Preferably, the terminal-side coil stage 3 comprises other auxiliary circuits of known type (not shown) operatively associated with the terminal-side coil 31, e.g. electronic circuits including temperature sensors, interface electronic circuits and the like.

In general, the terminal-side coil stage 3 may be of known type and it will further described in the following only with reference to the aspects of interest for the invention.

A power terminal 10, 10A, 10B further comprises a terminal-side control unit 6 for controlling operation of the terminal-side power stage 2 and of the terminal-side coil stage 3.

As an example, the terminal-side control unit 6 may include a controller (e.g. including one or more microprocessors) to control operation of power conversion circuits included in the terminal-side power stage 2 and, possibly, of auxiliary circuits included in the terminal-side coil stage 3.

Preferably, the terminal-side control unit 6 comprises a terminal-side wireless transceiver 61 having a unique terminal identification code (e.g. a MAC address). Conveniently, such a terminal identification code univocally identifies the power terminal 10, 10A, 10B including the terminal-side wireless transceiver 61.

The transceiver 61 may be of known type, e.g. of the Wi-Fi™ type or adopting another suitable wireless communication protocol.

Thanks to the transceiver 61, a power terminal 10, 10A, 10B is capable of communicating in a wireless manner with an electric vehicle 20 accessing to the power station 100.

In a preferred practical implementation of the invention, the terminal-side power stage 2 is arranged in a wall-box device installed at a parking space 101, 101A, 101B of the power station 100. Such a wall-box device may conveniently include, at least partially, the terminal-side control unit 6 (as shown in FIG. 1).

The terminal-side coil stage 3 is arranged or embedded in a ground pad device at a parking space 101, 101A, 101B of the power station 100. In some cases, such a ground pad device may conveniently include part of the terminal-side control unit 6.

An electric vehicle 20 comprises a vehicle-side coil stage 4 adapted to exchange AC electric power with the terminal-side coil stage 3 of a power terminal 10, 10A, 10B.

The vehicle-side coil stage 4 comprises a vehicle-side coil 41, along which an AC current is intended to circulate.

The vehicle-side coil stage 4 is inductively coupleable with the terminal-side coil 31.

When the vehicle-side coil 41 is inductively coupled with the terminal-side coil 31 of a power terminal 10, 10A, 10B (obviously with an air gap in therebetween), an AC current flowing along one of the coils (e.g. the terminal-side coil 31) produces a magnetic flux making an induced AC current to flow along the other coupled coil (e.g. the vehicle-side coil 41). In this way, electric power may be inductively exchanged between the terminal-side coil 31 and the vehicle-side coil 41. Of course, due to magnetic coupling losses, electric power is exchanged between paired terminal-side coil and vehicle-side coil 31, 41 with efficiency values $\eta<1$.

Preferably, the vehicle-side coil stage 4 comprises a second resonant capacitor (not shown) electrically coupled (e.g. in series) with the vehicle-side coil 41.

Preferably, the above-mentioned first and second resonant capacitors are designed to form a resonant RLC circuit together with the inductance of the paired terminal-side coil 31 and vehicle-side coil 41 and the equivalent impedance seen at the output terminals of the vehicle-side coil stage 4.

In this way, if the AC currents flowing along the terminal-side coil 31 and vehicle-side coil 41 have a fundamental frequency close or corresponding to the resonant frequency of such a resonant circuit, electric power may be exchanged between the terminal-side coil stage 3 and the vehicle-side coil stage 4 with high efficiency values, despite of the necessarily large air gap between the terminal-side coil 31 and the vehicle-side coil 41.

Preferably, the vehicle-side coil stage 4 comprises auxiliary circuits (not shown) operatively associated with the vehicle-side coil 41, e.g. electronic circuits including temperature sensors, interface electronic circuits and the like.

An electric vehicle 20 further comprises a vehicle-side power stage 5 adapted to exchange AC electric power with the vehicle-side coil stage 4.

Conveniently, the vehicle-side power stage 5 comprises suitable electronic circuits (e.g. power converters, filters, sensor arrangements and the like) to implement a controlled AC/DC conversion of electric power.

In general, the vehicle-side power stage 5 may be of known type and it will further described in the following only with reference to the aspects of interest for the invention.

An electric vehicle 20 additionally comprises a battery 8 electrically coupled with the vehicle-side power stage 5. Conveniently, the vehicle-side power stage 5 is adapted to exchange DC electric power with the battery 8.

An electric vehicle 20 further comprises a vehicle-side control unit 7 for controlling operation of the vehicle-side power stage 5 and of the vehicle-side coil stage 4.

As an example, the vehicle-side control unit 7 may include a controller (e.g. including one or more microprocessors) to control operation of power conversion circuits included in the vehicle-side power stage 5 and, possibly, of auxiliary circuits included in the vehicle-side coil stage 3.

Preferably, the vehicle-side control unit 7 comprises a vehicle-side wireless transceiver 71 having a unique vehicle identification code (e.g. a MAC address). Conveniently, such a vehicle identification code univocally identifies the electric vehicle 20 including the vehicle-side wireless transceiver 71.

The transceiver 71 may be of known type, e.g. of the Wi-Fi™ type or adopting another suitable wireless communication protocol.

Thanks to the transceiver 71, an electric vehicle 20 is capable of communicating in a wireless manner with a power terminal 10, 10A, 10B installed in the power station 100.

In a practical implementation of the invention, the vehicle-side coil stage 4, the vehicle-side power stage 5 and the vehicle-side control unit 7 are arranged (together with the battery 200) in suitable dedicated compartments on board the electric vehicle 20.

According to possible embodiments of the invention, the power station 100 comprises a central control unit 102 having a central wireless transceiver 103, which may be of known type, e.g. of the Wi-Fi™ type or adopting another suitable wireless communication protocol.

Conveniently, the central control unit 102 is adapted to communicate in a wireless manner with the electric vehicles 20 parked in the parking spaces 101, 101A, 101B of the power station 100.

A mainly important aspect of the method 1 of the invention consists in that said method comprises powering the terminal-side coil stage 3 of a power terminal 10, 10A, 10B with a test electric quantity $V_T$ to allow an electric vehicle 20 to determine whether said power terminal and said electric vehicle are in a paired condition, at which said power terminal and the electric vehicle 20 can exchange electric power, or in an unpaired condition, at which said power terminal and said electric vehicle cannot exchange electric power.

In other words, according to the invention, each power terminal 10, 10A, 10B is adapted to excite the respective terminal-side coil stage 3 with a test electric quantity $V_T$ to allow an electric vehicle 20 to determine whether said power terminal and said electric vehicle are in a paired condition or in an unpaired condition.

Preferably, the test electric quantity $V_T$ is a test voltage provided at the terminals of the terminal-side coil stage 3 by the terminal-side power stage 2. However, test electric quantities of different type may be used to power the terminal-side coil stage 3, e.g. a test current provided by the terminal-side power stage 2 and circulating along the terminal-side coil 31 or a test power provided at the terminals of the terminal-side coil stage 3 by the terminal-side power stage 2.

Preferably, the test electric quantity $V_T$ provided by the terminal-side power stage 2 has an intensity level very lower (e.g. 10 times lower) than the nominal intensity level that can be normally reached at steady-state during a possible power exchange between the power terminal 10, 10A, 10B and the electric vehicle 20, when these latter are in a paired condition.

Preferably, the terminal-side coil stage 3 is powered with the test electric quantity $V_T$ for a predetermined period of time (e.g. 0.5 s) starting from a given powering instant.

According to some embodiments of the invention, the terminal-side coil stage 3 may be powered with the test electric quantity $V_T$ upon the execution of a selection procedure of the power terminal 10 by an electric vehicle 20 only.

According to other embodiments of the invention, the terminal-side coil stage 3 may be powered with the test electric quantity $V_T$ periodically, at subsequent predetermined time-spaced powering instants (e.g. every 10 s), even when no electric vehicles are present, The method 1 of the invention will be now described in details with particular reference to FIGS. 2 and 3.

In a practical implementation, the method 1 comprises a sequence of steps that are conveniently carried out by a power terminal 10, 10A, 10B of the power station 100 and an electric vehicle 20 accessing to said power station.

More particularly, the steps of the method 1 are advantageously carried out by the terminal-side control unit 6 of a power terminal 10, 10A, 10B and the vehicle-side control unit 7 of an electric vehicle 20. To this aim, the terminal-side control unit 6 and the vehicle-side control unit 7 may execute suitable software instructions stored in suitable memory supports.

Preferably, the steps of method 1 are carried out when the electric vehicle 20 is turned off (and conveniently parked in a parking space 101, 101A, 101B) and unable to move (e.g. with the handbrake activated).

Preferably, the method 1 comprises a step 11 of selecting a power terminal 10 in a plurality of power terminals 10, 10A, 10B of the power station 100.

Preferably, in order to carry out the selection step 11 of the method 1, the vehicle-side control unit 7 acquires identification information (e.g. the identification code of the wireless transceiver 61 included in the terminal-side control unit 6) related to one or more power terminals 10, 10A, 10B in the nearby of the electric vehicle 20, e.g. within a useful wireless communication range.

According to possible embodiments of the invention, the vehicle-side control unit 7 carries out a search procedure of one or more power terminals 10, 10A, 10B (namely of the wireless transceivers 61 thereof) in the nearby of the electric vehicle 20 to request a wireless link with these latter. Then, the vehicle-side control unit 7 carries out a negotiation procedure with the searched power terminals 10, 10A, 10B (namely of the wireless transceivers 61 thereof) to acquire the above-mentioned identification information.

According to other possible embodiments of the invention, the vehicle-side control unit 7 acquires said identification information from the central control unit 102 of the power station 100. In this case, the vehicle-side control unit 7 transmits position information related to the location of the electric vehicle 20 (e.g. GPS data) to the central control unit 102 and receives said identification information directly from said central control unit.

Upon the acquisition of said identification information, in order to complete the selection step 11 of the method 1, the vehicle-side control unit 7 chooses a given power terminal 10 by choosing a suitable identification code in an identification list identifying the searched power terminals 10, 10A, 10B.

According to possible embodiments of the invention, when carrying out the selection step 11 of the method 1, the vehicle-side control unit 7 chooses a given power terminal 10 (namely the unique identification thereof) from said identification list in response to a command received by a user-interface device on board an electric vehicle 20.

According to other possible embodiments of the invention, the choice of a power terminal 10 is carried out automatically by the vehicle-side control unit 7, for example by choosing said power terminal in a random manner or depending on the strength of a wireless signal transmitted by the wireless transceiver 61 of said power terminal.

According to possible embodiments of the invention, when carrying out the selection step 11 of the method 1, after having chosen a power terminal 10, the vehicle-side control unit 7 preliminarily checks whether the chosen power terminal 10 is available for coupling with the electric vehicle 20.

If it is available for coupling (e.g. because already paired with another electric vehicle), the chosen power terminal 10 is finally selected and the following steps of the method 1 are carried out. In this case, a temporary communication channel 9a is conveniently established between the wireless transceiver 61 of the transmitter-side control unit 6 of the selected power terminal 10 and the wireless transceiver 71 of the vehicle-side control unit 7 of the electric vehicle 20.

If it is not available for coupling (e.g. because already paired with another electric vehicle), the chosen power terminal 10 is discarded (and cancelled from the above-mentioned identification list), any wireless communication with the chosen power terminal is interrupted by the vehicle-side control unit 7 and another power terminal is conveniently chosen from the acquired identification list.

Preferably, the method 1 comprises a step 12 of commanding the terminal-side power stage 2 to power the terminal-side coil stage 3 with the test electric quantity $V_T$.

Conveniently, the powering step 12 of the method 1 is carried out by the terminal-side control unit 6 by sending suitable control signals $C_T$ to the active electronic circuits (e.g. the power converters) of the terminal-side power stage 2.

According to some embodiments of the invention, the step 12 of the method 1 is carried out by the terminal-side control unit 6 upon receiving a command from the vehicle-side control unit 7 of the electric vehicle 20

According to other embodiments, the step 12 of the method 1 is carried out at a predetermined powering instants (conveniently set on a periodic basis as mentioned above) independently on the presence of an electric vehicle.

Preferably, the method 1 comprises a step 13 of checking 13 whether an induced electric quantity $V_I$ is provided by the vehicle-side coil stage 4 of the electric vehicle 20 in response to the powering of the terminal-side coil stage 3 of the selected power terminal 10 with the above-mentioned test electric quantity $V_T$.

Conveniently, the checking step 13 of the method 1 is carried out by the vehicle-side control unit 7 upon the completion of the above-mentioned selection step 11, possibly waiting for the selected power terminal 10 to power the respective the terminal-side coil stage 3.

Conveniently, the checking step 13 of the method 1 is carried out by the vehicle-side control unit 7 by acquiring and processing suitable detection data received from sensor arrangements included in the vehicle-side coil stage 4 and/or the vehicle-side power stage 5 (i.e. in at least one between these stages).

Preferably, the checked electric quantity $V_I$ is an induced check voltage provided at the terminals of the vehicle-side coil stage 4. However, induced electric quantities of different type may be checked, e.g. an induced check current circulating along the vehicle-side coil 41 or an induced check power provided at the terminals of the vehicle-side coil stage 4.

Preferably, the checked induced electric quantity $V_I$ has an intensity level very lower (e.g. 10 times lower) than the nominal intensity level that can be normally reached during a possible steady-state power exchange between the power terminal 10 and the electric vehicle 20, when these latter are in a paired condition.

Preferably, the method 1 comprises a step 14 of determining whether the selected power terminal 10 and the electric vehicle 20 are in a paired condition or in an unpaired condition basing on the above-mentioned checking step 13 of the method 1.

Conveniently, the determination step 14 of the method 1 is carried out by the vehicle-side control unit 7.

Preferably, if an induced electric quantity $V_I$ is provided by the vehicle-side coil stage 4 in response to the powering of the terminal-side coil stage 3 with the test electric quantity $V_T$, the vehicle-side control unit 7 determines that the selected power terminal 10 and the electric vehicle 20 are in a paired condition.

Indeed, the presence of an induced electric quantity $V_I$ provided by the vehicle-side coil stage 4 is indicative of the circumstance that the selected power terminal 10 is the correct power terminal with which the electric vehicle 20 has to interact for carrying out power exchange functionalities. In other words, the presence of an induced electric quantity $V_I$ provided by the vehicle-side coil stage 4 means that the selected power terminal 10 is exactly the power terminal installed at the parking space 101 where the electric vehicle is parked.

In this case, a permanent communication channel 9 is conveniently established between the wireless transceiver 61 of the transmitter-side control unit 6 of the selected power terminal 10 and the wireless transceiver 71 of the vehicle-side control unit 7 of the electric vehicle 20.

Power exchange between the selected power terminal 10 and the electric vehicle 20 may thus be conveniently carried out, according to the needs.

Conveniently, information exchanged through the communication channel 9 between the transmitter-side control unit 6 of the selected power terminal 10 and the vehicle-side control unit 7 of the electric vehicle 20 may be duly processed to implement suitable control strategies to carry out said power exchange functionalities.

Preferably, if the selected power terminal 10 and the electric vehicle 20 are determined to be in a paired condition, the transmitter-side control unit 6 of the selected power terminal 10 inhibits or prevent the respective wireless transceiver 61 to communicate with other electric vehicles. This solution is advantageously directed to simplify the selection of the most suitable power terminal 10, 10A, 10B by the electric vehicles accessing to the power station 100.

Preferably, if an induced electric quantity $V_I$ is not provided by the vehicle-side coil stage 4 in response to the powering of the terminal-side coil stage 3 with the test electric quantity $V_T$, the vehicle-side control unit 7 determines that the selected power terminal 10 and the electric vehicle 20 are in an unpaired condition.

In this case, the selected power terminal 10 is discarded (and cancelled from the above-mentioned identification list), any wireless communication with the selected power terminal is interrupted by the vehicle-side control unit 7 and the above-mentioned selection step is repeated in full or in part, e.g. by choosing another power terminal according to one of the choosing modes illustrated above.

It is evident from the above how an additional aspect of the invention relates to the power station 100 that is capable of providing improved pairing functionalities between the installed power terminals 10, 10A, 10B and electric vehicles 20 accessing to said power station.

In the power station 100, each power terminal 10, 10A, 10B is adapted to power the respective terminal-side coil stage 3 with a test electric quantity $V_T$ to allow an electric vehicle 20 to determine whether said power terminal and said electric vehicle are in a paired condition, at which said power terminal and said electric vehicle can exchange electric power, or in an unpaired condition, at which said power terminal and said electric vehicle cannot exchange electric power.

The method and the power station, according to the invention, allow achieving the intended aims and objects.

Even if electric vehicles and power terminals are designed to mutually interact and communicate in a wireless manner, the pairing process between the electric vehicles and the power terminals of the power station, according to the invention, is efficiently managed to make any electric vehicle to pair with the correct power terminal, namely with the power terminal installed at the parking space at which said electric vehicle is parked.

In order to be carried out, the method, according to the invention, does not require any dedicated additional hardware with respect circuits, devices or components adopted for carrying out the power exchange functionalities when the correct pairing between the power terminals and the electric vehicles is obtained.

The method and the power station, according to the invention, can be thus be easily implemented and arranged at competitive costs with respect to similar systems of the state of the art.

The invention claimed is:

1. A method for pairing a power terminal of a plurality of power terminals in power station and an electric vehicle,
   wherein each of the plurality of power terminals comprises:
      a terminal-side power stage electrically coupled with an electric power system; and
      a terminal-side coil stage electrically coupled with the terminal-side power stage and comprising a terminal-side coil,
   wherein the electric vehicle comprises:
      a vehicle-side coil stage comprising a vehicle-side coil inductively coupleable when aligned with the terminal-side coil of a power terminal;
      a vehicle-side power stage electrically coupled with the vehicle-side coil stage; and
      a battery electrically coupled with the vehicle-side power stage,
   wherein the power terminal and the electric vehicle are configured to communicate in a wireless manner, the power terminal being identified by a unique terminal identification code, and
   wherein the method comprises:
      aligning the vehicle-side coil with the terminal-side coil of a power terminal;
      (a) selecting one of the power terminals of the plurality of power terminals;
      (b) commanding the terminal-side power stage of the selected power terminal to power a corresponding terminal-side coil stage with a test electric quantity;
      (c) determining whether an induced electric quantity is provided by the vehicle-side coil stage in response to powering the corresponding terminal-side coil stage with the test electric quantity;
      (d) determining whether the selected power terminal and the electric vehicle are in a paired condition or in an unpaired condition depending on whether the induced electric quantity is provided or not provided, respectively, by the vehicle-side coil stage in response to powering the corresponding terminal-side coil stage;
      (e) determining that the selected power terminal and the electric vehicle are not in the paired condition;
      (f) selecting different power terminals of the plurality of power terminals and repeating (a) to (d) until one of the different power terminals and the electric vehicle are in the paired condition; and
      commanding the terminal-side power stage of the one of the different power terminals in the paired condition to power its corresponding terminal-side coil stage with a nominal electric quantity to charge the electric vehicle.

2. The method according to claim 1, wherein the electric vehicle is determined to be in the paired condition if the induced electric quantity is provided by the vehicle-side coil stage in response to powering the corresponding terminal-side coil stage.

3. The method according to claim 2, wherein the selected power terminal and the electric vehicle are determined to be in the unpaired condition if the induced electric quantity is not provided by the vehicle-side coil stage in response to powering the corresponding terminal-side coil stage.

4. The method according to claim 3, wherein the test electric quantity has an intensity level lower than an intensity level of the nominal electrical quantity.

5. The method according to claim 4, wherein the corresponding terminal-side coil stage of the selected power terminal is powered with the test electric quantity for a predetermined period of time.

6. The method according to claim 5, wherein the corresponding terminal-side coil stage of the selected power terminal is powered with the test electric quantity at subsequent periodic powering instants.

7. The method according to claim 1, wherein the selected power terminal and the electric vehicle are determined to be in the unpaired condition if the induced electric quantity is not provided by the vehicle-side coil stage in response to powering the corresponding terminal-side coil stage.

8. The method according to claim 7, wherein the test electric quantity has an intensity level lower than an intensity level of the nominal electrical quantity.

9. The method according to claim 7, wherein the corresponding terminal-side coil stage of the selected power terminal is powered with the test electric quantity for a predetermined period of time.

10. The method according to claim 1, wherein the corresponding terminal-side coil stage of the selected power terminal is powered with the test electric quantity for a predetermined period of time.

11. The method according to claim 1, wherein the corresponding terminal-side coil stage of the selected power terminal is powered with the test electric quantity at subsequent periodic powering instants.

12. The method according to claim 1, wherein the power station comprises a central control unit configured to communicate in a wireless manner with the electric vehicle, and wherein selecting one of the power terminals further comprises:
   transmitting position information related to a location of the electric vehicle to the central control unit; and
   receiving identification information related to one or more of the plurality of power terminals that are nearby the electric vehicle.

13. The method according to claim 1, wherein selecting one of the power terminals further comprises choosing one of the power terminals in response to a command received by a user-interface device on board the electric vehicle.

14. The method according to claim 1, wherein selecting one of the power terminals further comprises choosing one of the power terminals depending on a strength of a wireless signal transmitted by the selected power terminal or choosing the selected power terminal randomly.

15. The method according to claim 1, wherein selecting one of the power terminals further comprises checking whether the selected power terminal is available for pairing with the electric vehicle.

16. The method according to claim 1, wherein selecting the power terminal is performed when the electric vehicle is turned off and unable to move.

17. The method according to claim 1, wherein the test electric quantity has an intensity level lower than an intensity level of the nominal electrical quantity.

18. A power station for electric vehicles, the power station comprising a plurality of parking spaces, each parking space including a power terminal of a plurality of power terminals for exchanging electric power with one of the electric vehicles, wherein each of the plurality of power terminals comprises:
- a terminal-side power stage electrically coupled with an electric power system;
- a terminal-side coil stage electrically coupled with the terminal-side power stage and comprising a terminal-side coil; and
- a terminal-side control unit for controlling operation of the terminal-side power stage and the terminal-side coil stage, the terminal-side control unit comprising a terminal-side wireless transceiver having a unique terminal identification code, wherein an electric vehicle comprises:
- a vehicle-side coil stage comprising a vehicle-side coil inductively coupleable when aligned with the terminal-side coil of a power terminal;
- a vehicle-side power stage electrically coupled with the vehicle-side coil stage;
- a battery electrically coupled with the vehicle-side power stage; and
- a vehicle-side control unit for controlling operation of the vehicle-side power stage and the vehicle-side coil stage, the vehicle-side control unit comprising a vehicle-side wireless transceiver, wherein the terminal-side control unit and the vehicle-side control unit are configured to communicate in a wireless manner, and wherein the vehicle-side control unit is configured to:
- (a) select one of the power terminals of the plurality of power terminals in response to the vehicle-side coil being aligned with the terminal-side coil of one of the parking spaces;
- (b) command the terminal-side control unit of the selected power terminal to power a corresponding terminal-side coil stage with a test electric quantity;
- (c) determine whether an induced electric quantity is provided by the vehicle-side coil stage in response to powering the corresponding terminal-side coil stage with the test electric quantity;
- (d) determine whether the selected power terminal and the electric vehicle are in a paired condition or in an unpaired condition depending on whether the induced electric quantity is provided or not provided, respectively, by the vehicle-side coil stage in response to powering the corresponding terminal-side coil stage;
- (e) determine that the selected power terminal and the electric vehicle are not in the paired condition;
- (f) select different power terminals of the plurality of power terminals and repeating (a) to (d) until one of the different power terminals and the electric vehicle are in the paired condition; and command the terminal-side control unit of the one the different power terminals in the paired condition to power its corresponding terminal-side coil stage with a nominal electric quantity to charge the electric vehicle.

19. The power station according to claim 18, wherein the test electric quantity has an intensity level lower than an intensity level of the nominal electrical quantity.

20. The power station according to claim 18, wherein the corresponding terminal-side coil stage of the selected power terminal is powered with the test electric quantity for a predetermined period of time.

* * * * *